(12) United States Patent
Hong et al.

(10) Patent No.: US 7,842,578 B2
(45) Date of Patent: Nov. 30, 2010

(54) METHOD FOR FABRICATING MOS DEVICES WITH A SALICIDED GATE AND SOURCE/DRAIN COMBINED WITH A NON-SILICIDE SOURCE DRAIN REGIONS

(75) Inventors: Zhong Shan Hong, Shanghai (CN); Xian Yong Pu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 416 days.

(21) Appl. No.: 11/615,967

(22) Filed: Dec. 23, 2006

(65) Prior Publication Data
US 2008/0145990 A1    Jun. 19, 2008

(30) Foreign Application Priority Data
Dec. 14, 2006    (CN) .................. 2006 1 0147451

(51) Int. Cl.
*H01L 21/336* (2006.01)
(52) U.S. Cl. .................. 438/299; 438/301; 438/303; 438/592; 438/199; 257/E21.438
(58) Field of Classification Search .......... 438/299, 438/303; 257/E21.438
See application file for complete search history.

(56) References Cited
U.S. PATENT DOCUMENTS

| | | | |
|---|---|---|---|
| 6,025,267 A * | 2/2000 | Pey et al. .................. 438/656 |
| 6,069,037 A * | 5/2000 | Liao .................. 438/241 |
| 6,391,148 B2 | 5/2002 | Marks et al. |
| 6,506,670 B2 * | 1/2003 | Schoenborn .................. 438/592 |
| 2003/0178665 A1 * | 9/2003 | Takenaka .................. 257/306 |
| 2008/0272420 A1 * | 11/2008 | Lee .................. 257/292 |

FOREIGN PATENT DOCUMENTS

| CN | 1147691 | 4/1997 |
|---|---|---|
| CN | 1435875 | 8/2003 |

\* cited by examiner

*Primary Examiner*—Thanh Nguyen
(74) *Attorney, Agent, or Firm*—Townsend and Townsend and Crew LLP

(57) ABSTRACT

A method for fabricating an integrated circuit device, e.g., CMOS image sensor. The method includes providing a semiconductor substrate, which has a first device region and a second device region. The method forms a gate polysilicon layer overlying the first and second device regions. The method forms a silicide layer overlying the gate polysilicon layer. The method patterns the silicide layer and gate polysilicon layer to form a first silicided gate structure in the first device region and a second silicided gate structure in the second device region. The method also includes forming a blocking layer overlying the second device region. The method forms a silicide material overlying a first source region and a first drain region associated with the first silicided gate structure, and maintaining a second source region and a second drain region associated with the second silicided gate structure free from any silicide using the blocking layer.

19 Claims, 4 Drawing Sheets

METHOD FOR FABRICATING MOS DEVICES WITH A SALICIDED GATE AND SOURCE/DRAIN COMBINED WITH A NON-SILICIDE SOURCE DRAIN REGIONS

CROSS-REFERENCES TO RELATED APPLICATIONS

This application claims priority to Chinese Application No. 200610147451.3; filed on Dec. 14, 2006; commonly assigned, and of which is hereby incorporated by reference for all purposes.

BACKGROUND OF THE INVENTION

The present invention is directed to integrated circuits and their processing for the manufacture of semiconductor devices. More particularly, the invention provides a method and device for manufacturing a silicided and non-silicided MOS transistor structure, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of a process that has limitations based upon a given feature size is the formation of contact structures for MOS transistor devices. Such contact structures are often formed using silicided metal layers. Such silicided metal layers are often formed using complex techniques. These and other limitations of the conventional MOS transistor devices can be found throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and device for manufacturing a silicided and non-silicided MOS transistor structure, but it would be recognized that the invention has a much broader range of applicability.

In a specific embodiment, the present invention provides a method for fabricating an integrated circuit device, e.g., CMOS image sensor. The method includes providing a semiconductor substrate, which has a first device region and a second device region. In a specific embodiment, the substrate is selected from a silicon substrate, silicon-on-insulator substrate, and epitaxial wafer. The present method includes forming a trench isolation structure between the first device region and the second device region. The method also forms a gate polysilicon layer overlying the first device region and the second device region. The method forms a silicide layer overlying the gate polysilicon layer. The method patterns the silicide layer and gate polysilicon layer to form a first silicided gate structure in the first device region and a second silicided gate structure in the second device region. In a specific embodiment, the method forms a first sidewall spacer structure on the first silicided gate structure and a second sidewall spacer structure on the second silicided gate structure. The method also includes forming a blocking layer overlying the second silicided gate structure and exposed portion of the second device region. The method forms a silicide material overlying a first source region and a first drain region associated with the first silicided gate structure. In a specific embodiment, the method also includes maintaining a second source region and a second drain region associated with the second silicided gate structure free from any silicide using the blocking layer. The method strips the oxide blocking layer to expose the second source region and the second drain region.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an MOS transistor structure with both silicided and non-silicided regions according to a specific embodiment. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
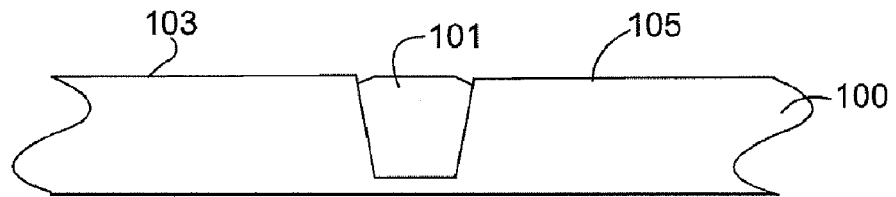
FIGS. 1 through 8 illustrate a method for forming MOS transistors according to embodiments of the present invention.

According to the present invention, techniques for processing integrated circuits for the manufacture of semiconductor devices are provided. More particularly, the invention provides a method and device for manufacturing a silicided and non-silicided MOS transistor structure, but it would be recognized that the invention has a much broader range of applicability.

A method for manufacturing silicided MOS device structures according to an embodiment of the present invention may be outlined as follows.

1. Provide a semiconductor substrate, e.g., silicon wafer, the substrate comprising a first device region and a second device region;
2. Form a trench isolation structure between the first device region and the second device region;
3. Form a gate polysilicon layer overlying the first device region and the second device region;
4. Form a silicide layer overlying the gate polysilicon layer;
5. Pattern the silicide layer and gate polysilicon layer to form a first silicided gate structure in the first device region and a second silicided gate structure in the second device region;
6. Form a first sidewall spacer structure on the first silicided gate structure and a second sidewall spacer structure on the second silicided gate structure;
7. Form a blocking layer overlying the second silicided gate structure and exposed portion of the second device region;
8. Form a silicide material overlying a first source region and a first drain region associated with the first silicided gate structure;
9. Maintain a second source region and a second drain region associated with the second silicided gate structure free from any silicide using the blocking layer;
10. Strip the oxide blocking layer to expose the second source region and the second drain region; and
11. Perform other steps, as desired.

The above sequence of steps provides a method according to an embodiment of the present invention. In a specific embodiment, the present invention provides a silicided and non-silicided source drain region for MOS transistors. Other alternatives can also be provided where steps are added, one or more steps are removed, or one or more steps are provided in a different sequence without departing from the scope of the claims herein. Details of the present method and structure can be found throughout the present specification and more particularly below.

FIGS. 1 through 8 illustrate a method for forming MOS transistors according to embodiments of the present invention. These diagrams are merely examples, which should not unduly limit the scope of the claims herein. One of ordinary skill in the art would recognize other variations, modifications, and alternatives. As shown, the present invention provides a method for fabricating an integrated circuit device, e.g., CMOS image sensor. The method includes providing a semiconductor substrate 100, which has a first device region 103 and a second device region 105. In a specific embodiment, the substrate is selected from a silicon substrate, silicon-on-insulator substrate, and epitaxial wafer. The present method includes forming a trench isolation structure 101 between the first device region and the second device region. In a specific embodiment, the trench isolation region is a shallow trench isolation structure, commonly called STI, but can be others.

Figure 2:
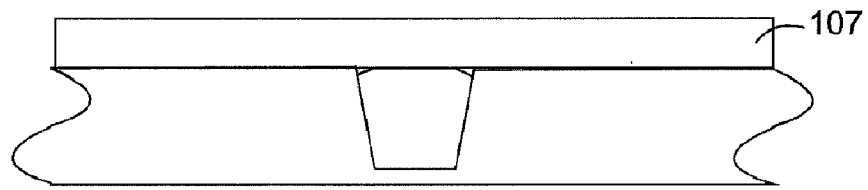

In a specific embodiment, the method also forms a gate polysilicon layer 107 overlying the first device region and the second device region, as illustrated by the simplified diagram of FIG. 2. The polysilicon layer is often in-situ doped, implanted, or has other impurities to form conductive characteristics. Of course, there can be other variations, modifications, and alternatives.

Figure 3:
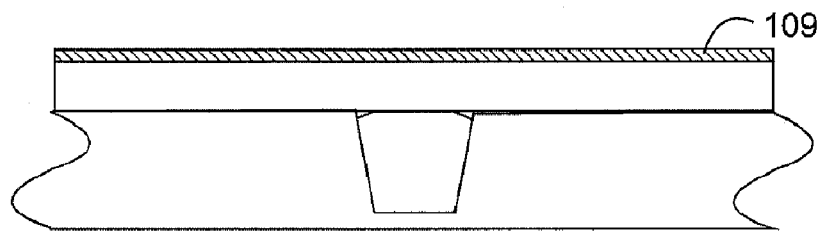

In specific embodiment, the method forms a silicide layer 109 overlying the gate polysilicon layer, as illustrated by the simplified diagram of FIG. 3. In a specific embodiment, the silicide layer can be selected from a suitable material such as a titanium, cobalt, tungsten, or nickel. Depending upon the embodiment, the material can be deposited and subsequently annealed.

Figure 4:
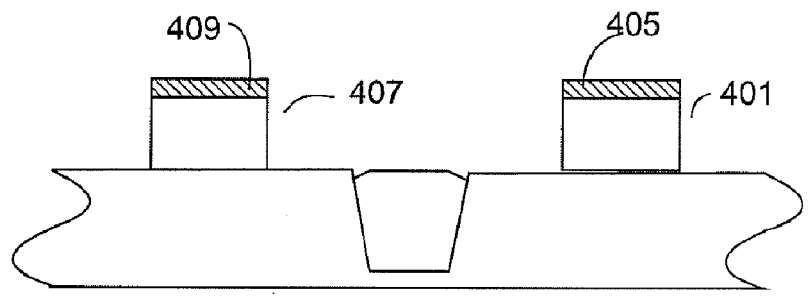

Referring to FIG. 4, the method patterns the silicide layer and gate polysilicon layer to form a first silicided gate structure in the first device region and a second silicided gate structure in the second device region. As shown, the patterned silicide layer 405, 409 is provided on the first gate structure 407 and second gate structure 401. In a specific embodiment, the patterning occurs using photolithographic techniques and etching. Depending upon the embodiment, the channel region associated with the gate structure can have a design rule of 0.18 micron and less. Of course, there can be other variations, modifications, and alternatives.

Figure 5:
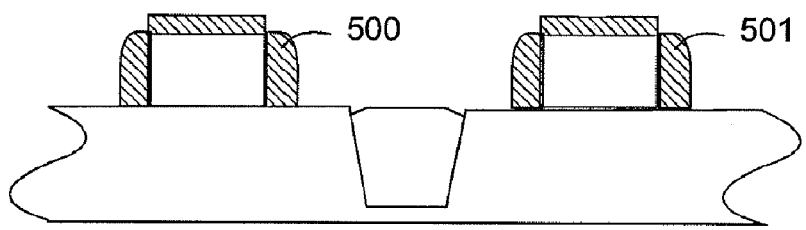

In a specific embodiment, the method forms a first sidewall spacer structure 500 on the first silicided gate structure and a second sidewall spacer structure 501 on the second silicided gate structure, as illustrated by FIG. 5. The spacer structures are formed using deposition of an oxide layer, such as silicon nitride, silicon dioxide, tetraethyl ortho-silicate, commonly called TEOS, and others. The deposited layer is subjected to anisotropic etching to form the sidewall spacer structures according to an embodiment of the present invention. Depending upon the embodiment, source and drain regions are formed using implantation processes.

Figure 6:
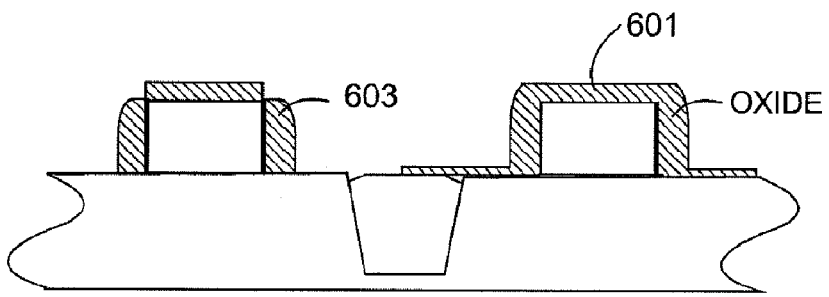

Referring to FIG. 6, the method also includes forming a blocking layer 601 overlying the second silicided gate structure and exposed portion of the second device region. The blocking layer is made using an oxide film and/or TEOS material that is blanket deposited overlying the exposed surfaces of the substrate. The method masks region 601 of the blocking layer, while exposing other regions, which are subjected to etching to expose the region in the first device region.

Figure 7:
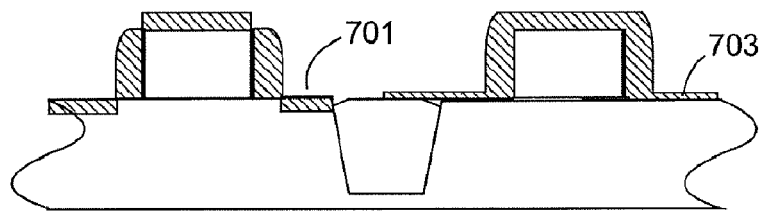
Figure 8:
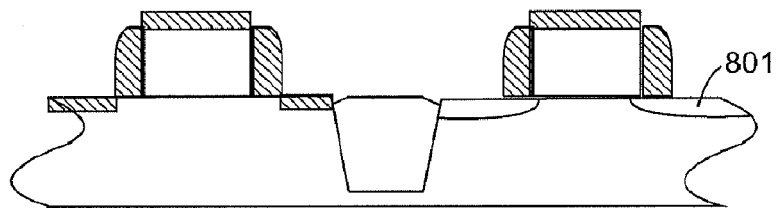

Referring to FIG. 7, the method forms a silicide material 701 overlying a first source region and a first drain region associated with the first silicided gate structure. The silicide material can be nickel, cobalt, or titanium. Once the silicide material has been formed, the method performs an annealing process to alloy the silicide material with exposed portions of the silicon material according to a specific embodiment. In a specific embodiment, the method also includes maintaining a second source region and a second drain region associated with the second silicided gate structure free 801 from any silicide using the blocking layer, as illustrated by FIG. 8. The method strips the oxide blocking layer to expose the second source region and the second drain region. The strips the oxide blocking layer with wet and/or dry etching processes. Such processes can use fluorine bearing species, such as hydrofluoric acid, buffered hydrofluoric acid, and a plasma having a fluorine bearing species. Of course, there can be other variations, modifications, and alternatives.

The above sequence of steps provides a method according to an embodiment of the present invention. In a specific embodiment, the present invention provides a silicided and non-silicided source drain region for MOS transistors. Other alternatives can also be provided where steps are added, one or more steps are removed, or one or more steps are provided in a different sequence without departing from the scope of the claims herein. Details of the present method and structure can be found throughout the present specification and more particularly below.

Figure 9:
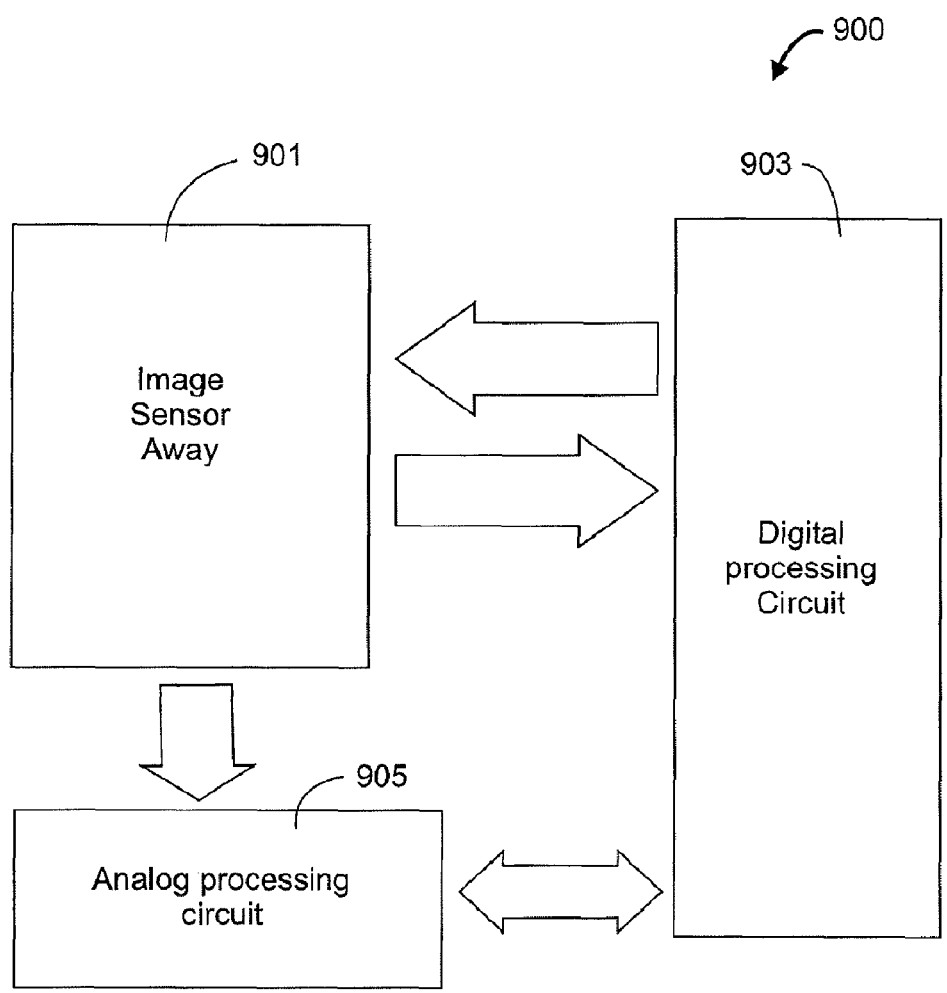
FIG. 9 is a simplified diagram illustrating a CMOS image sensor using the present MOS transistors according to an embodiment of the present invention.

FIG. 9 is a simplified diagram illustrating a CMOS image sensor using the present MOS transistors according to an embodiment of the present invention. This diagram is merely an example, which should not unduly limit the scope of the claims herein. One of ordinary skill in the art would recognize other variations, modifications, and alternatives. As shown, CMOS image sensor 900 includes an image sensor array 901, digital processing circuit 903, and analog process circuit 905.

In a specific embodiment, the digital processing circuit includes transistors having silicided source and drain to reduce resistance. In certain embodiments, un-silicided source and drain are preferred in circuit blocks such as the image sensor array and the analog processing circuit. According to an embodiment of the present invention, a method is provided to form silicided source and drain regions in a first region of an integrated circuit and to form un-silicided source and drain regions in a second region of the integrated circuit. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating an integrated circuit device, the method comprising:
   providing a semiconductor substrate, the substrate comprising a first device region and a second device region, the first device region having a digital processing circuit and the second device region having an analog processing circuit;
   forming a trench isolation structure between the first device region and the second device region;
   forming a gate polysilicon layer overlying the first device region and the second device region;
   forming a silicide layer overlying the gate polysilicon layer;
   patterning the silicide layer and gate polysilicon layer to form a first silicided gate structure in the first device region and a second silicided gate structure in the second device region;
   forming a first sidewall spacer structure on the first silicided gate structure and a second sidewall spacer structure on the second silicided gate structure;
   forming a blocking layer overlying the second silicided gate structure and exposed portion of the second device region;
   forming a silicide material overlying a first source region and a first drain region associated with the first silicided gate structure;
   performing a single annealing process to form an alloy material from at least the silicide material and the first silicided gate structure;
   maintaining a second source region and a second drain region associated with the second silicided gate structure free from any silicide using the blocking layer; and
   stripping the oxide blocking layer to expose the second source region and the second drain region.

2. The method of claim 1 wherein the blocking layer comprises an oxide layer.

3. The method of claim 1 wherein the blocking layer comprises a TEOS oxide.

4. The method of claim 1 wherein the first silicided gate structure is one of a plurality of gate structures in the first device region.

5. The method of claim 1 wherein the second silicided gate structure is one of a plurality of gate structures in the second device region.

6. The method of claim 1 wherein the second silicided gate structure is for a CMOS image sensor.

7. The method of claim 1 wherein the first silicided gate structure is characterized by a design rule of 0.18 micron and less.

8. The method of claim 1 wherein the blocking layer comprises a TEOS material of at least 200 Angstroms.

9. The method of claim 1 wherein the silicide layer is selected from a titanium, cobalt, tungsten, or nickel.

10. The method of claim 1 wherein the stripping comprises subjecting the blocking layer to a fluorine bearing species.

11. The method of claim 10 wherein the fluorine bearing species is hydrofluoric acid or buffered hydrofluoric acid.

12. The method of claim 10 wherein the fluorine bearing species is derived from a plasma environment.

13. The method of claim 1 wherein the silicide material is selected from a titanium, cobalt, or nickel.

14. A method for fabricating an integrated circuit device, the method comprising:
   providing a semiconductor substrate, the semiconductor substrate comprising a first device region and a second device region;
   forming a trench isolation structure between the first device region and the second device region;
   forming a gate polysilicon layer overlying the first device region and the second device region;
   forming a silicide layer overlying the gate polysilicon layer;
   patterning the silicide layer and gate polysilicon layer to form a first silicided gate structure in the first device region and a second silicided gate structure in the second device region;
   forming a first sidewall spacer structure on the first silicided gate structure and a second sidewall spacer structure on the second silicided gate structure;
   forming a blocking layer overlying the second silicided gate structure and exposed portion of the second device region;
   forming a silicide material overlying a first source region and a first drain region associated with the first silicided gate structure;
   performing a single annealing process to form an alloy from at least the silicide material and the first silicided gate structure;
   maintaining a second source region and a second drain region associated with the second silicided gate structure free from any silicide using the blocking layer; and
   stripping the oxide blocking layer to expose the second source region and the second drain region to form a first transistor including the first silicided gate structure the silicided source first source region and the silicided first drain region and to-form a second transistor including the second silicided gate structure, the second silicide-free source region and the second silicide-free drain region;
   wherein the first transistor is an element of a digital processing circuit;
   wherein the second transistor is an element of an analog processing circuit.

15. The method of claim 14 wherein the blocking layer comprises an oxide layer.

16. The method of claim 14 wherein the blocking layer comprises a TEOS oxide.

17. The method of claim 14 wherein the first silicided gate structure is one of a plurality of gate structures in the first device region.

18. The method of claim 14 wherein the second silicided gate structure is one of a plurality of gate structures in the second device region.

19. The method of claim 14 wherein the second silicided gate structure is for a CMOS image sensor.

* * * * *